United States Patent [19]

Ishikawa

[11] Patent Number: 5,217,841

[45] Date of Patent: Jun. 8, 1993

[54] IMAGE TRANSFER TYPE RECORDING METHOD

[75] Inventor: Keiko Ishikawa, Okazaki, Japan

[73] Assignee: Brother Kogyo Kabushiki Kaisha, Japan

[21] Appl. No.: 668,788

[22] Filed: Mar. 13, 1991

[30] Foreign Application Priority Data

Oct. 4, 1988 [JP] Japan ................. 63-250549

[51] Int. Cl.$^5$ ................. G03C 1/90; G03C 11/12
[52] U.S. Cl. ................. 430/256; 430/138; 430/259; 430/262; 430/263; 503/214; 503/215; 503/226
[58] Field of Search ............ 430/138, 256, 257, 259, 430/262, 263, 211, 235; 503/214, 215, 226

[56] References Cited

U.S. PATENT DOCUMENTS

| | | | |
|---|---|---|---|
| 3,721,557 | 3/1973 | Inoue | 430/257 |
| 4,865,938 | 9/1989 | Sakai et al. | 430/138 |
| 4,940,643 | 7/1990 | Sakai et al. | 430/108 |
| 4,943,509 | 7/1990 | Sakai et al. | 430/138 |
| 5,019,471 | 5/1991 | Mino et al. | 430/259 |
| 5,019,475 | 5/1991 | Higashiyama et al. | 430/262 |
| 5,043,314 | 8/1991 | Suzuki et al. | 430/138 |

FOREIGN PATENT DOCUMENTS 297947  4/1990  Japan .

*Primary Examiner*—Richard L. Schilling
*Attorney, Agent, or Firm*—Oliff & Berridge

[57] ABSTRACT

An image transfer type recording method and kits for forming images on a receiving medium stably adheres a developer layer to any type of image receiving medium, such as, for example, plain paper, cloths, plastic films or the like. According to an image transfer type recording method, the image formation layer and the image receiving medium are adhered to each other by an adhesive layer. Therefore, the image formation layer can be stably adhered to any type of image receiving medium The image formation layer is adhered to the image receiving medium while being sandwiched between a thermoplastic resin layer and the adhesive layer. Therefore, the color of the image formed on the image formation layer is not faded or reduced in brightness, even if the image is formed on media made from cloth and such media on which the image is formed is washed.

7 Claims, 6 Drawing Sheets

IMAGE TRANSFER TYPE RECORDING METHOD

BACKGROUND OF THE INVENTION

1. Field of the Invention

The present invention relates to an image transfer type recording method and to kits for transferring and forming an image onto any type of image receiving medium such as plain paper, cloth, and plastic films.

2. Description of Related Art

As disclosed in U.S. Pat. No. 4,399,209, an image formation method is known for forming an image onto a developer medium using a photosensitive and pressure sensitive medium comprised of microcapsules which encapsulate a dyeprecursor, light hardening resin, and light polymerization initiator coated onto a base sheet, and a developer medium coated with a developer material which is color-reactable with the dyeprecursor encapsulated in the microcapsules on the base sheet. In this image formation method, the light hardening resin encapsulated in the microcapsules is selectively hardened by being exposed to light containing image information. Afterwards, the microcapsule layer of the photosensitive and pressure sensitive medium and the developer layer of the developer medium are superposed and are pressurized, and the microcapsules which are not hardened in the exposing operation are ruptured. As a result, a visible image is formed in the developer layer of the developer medium by color-reaction of the dyeprecursor which flows out from the ruptured microcapsules and the developer material of the developer medium.

However, in the above-mentioned image formation method, the image can be formed only onto the developer medium which has the developer layer, and not onto any other type of image receiving medium such as plain paper, cloths, plastic films or the like.

Therefore, in order to form an image onto any arbitrary type of image receiving medium, a method for adhering a developer medium on which an image can be formed onto any type of image receiving medium by using an adhesive layer is disclosed in U.S. Pat. No. 4,865,938. However, this adhesive process which uses the adhesive layer causes the following problems when the developer medium is adhered to an image receiving medium by the adhesive layer: the thickness of the image receiving medium increases and the weight of the image receiving medium becomes heavy.

In order to resolve this disadvantage, a further improved image transfer type recording system is provided, for example, in U.S. Pat. No. 5,019,475, filed by the same applicant as the present invention. In this improved system, a developer medium which includes a base sheet having a thermoplastic resin layer formed thereon, and a developer layer formed on the thermoplastic resin layer is used. The developer layer includes a developer and a binder for holding the developer together. An image is formed onto the developer layer of the developer medium. The developer layer of the developer medium on which the image is formed is then superposed over any type of image receiving medium. Next, the superposed developer medium and the image receiving medium are heated and pressurized by a heat roller. Then, the developer and the binder included in the developer layer melt, and the developer layer adheres to the image receiving medium. Moreover, the thermoplastic resin layer is also melted and the base sheet is peeled from the thermoplastic resin layer. As a result, the base sheet is peeled from the thermoplastic resin layer, and only the developer layer of the developer medium and the thermoplastic resin layer are adhered to the image receiving medium.

However, the above-mentioned system causes the following problems because the developer layer of the developer medium is adhered directly to the image receiving medium. The developer layer includes the developer and the binder. The developer layer and the image receiving medium are united to each other by the adhesive power of the binder included in the developer layer. The amount of binder included in the developer layer is about 10 weight percent of the entire developer layer. Therefore, the power for uniting the developer layer and the image receiving medium is not strong, and the developer layer peels off easily from the image receiving medium. In order to increase the power for uniting the developer layer to the image receiving medium, the percentage of the binder included in the developer layer is increased. However, when the percentage of the binder is increased, the percentage (or amount) of the developer is decreased, so that the developer layer is not colored easily and, consequently, a clear image cannot be formed onto the developer layer.

Moreover, when the receiving medium on which the colored image is formed is apparel, and when such apparel is washed, water or soapy water soaks into the developer layer from the rear side of the apparel and the color of the image is faded.

OBJECTS AND SUMMARY OF THE INVENTION

It is an object of the present invention to overcome the above problems and to provide an image transfer type recording method and kits which stably adheres a developer layer to any type of image receiving medium, such as, for example, plain paper, cloths, plastic films or the like.

It is another object of the present invention to provide an image transfer type recording method and kits for forming an image on a receiving medium, wherein the color of the image formed thereby or thereon is not faded, even if the image is formed on apparel which is later washed.

In order to attain the above and other objects, and to overcome the shortcomings discussed above, an image transfer type recording method according to the present invention comprises the steps of: superposing a thermoplastic resin layer of a thermoplastic resin medium having a first base sheet and the thermoplastic resin layer formed on the first base sheet with an image formation layer of an image formation medium having a second base sheet and the image formation layer formed on the second base sheet; adhering the thermoplastic resin layer with the image formation layer by heating the superposed thermoplastic resin medium and the image formation medium; separating the second base sheet from the image formation layer; inserting an adhesive layer between any type of image receiving medium and the image formation layer; adhering the image receiving medium with the image formation layer by superposing the image receiving medium with the image formation layer through the adhesive layer; and separating the first base sheet from the thermoplastic resin layer.

In order to attain the above objects, a kit for forming images on a receiving medium is provided. The kit includes a thermoplastic resin medium, an image formation medium, and optionally, an adhesive medium. Preferably the above media are sealed within a package. The thermoplastic resin medium includes a first base sheet having a thermoplastic resin layer formed thereon. The image formation medium includes a second base sheet and an image formation layer either formed on the second base sheet, or formed on an adhesive layer which is located on the second base sheet. If the adhesive layer is not provided on the second base sheet, the adhesive layer is formed on a third base sheet, which together form the adhesive medium. The image formation layer can be, for example, a developer material which is capable of forming a visible image upon reacting with a dyeprecursor.

According to an image transfer type recording method and the kit for forming images on a receiving medium of the present invention, the image formation layer and any type of image receiving medium are adhered to each other by the adhesive layer. Therefore, the image formation layer can be stably adhered to any type of medium upon which it is desired to form an image. On the other hand, the image formation layer is adhered to the image receiving medium while being sandwiched between the thermoplastic resin layer and the adhesive layer. Therefore, the color of the image formed on the image formation layer is not faded or reduced, even if the image is formed on image receiving medium such as cloth and such image receiving medium on which the image is formed is washed.

DETAILED DESCRIPTION OF THE PREFERRED EMBODIMENTS

Figure 1:
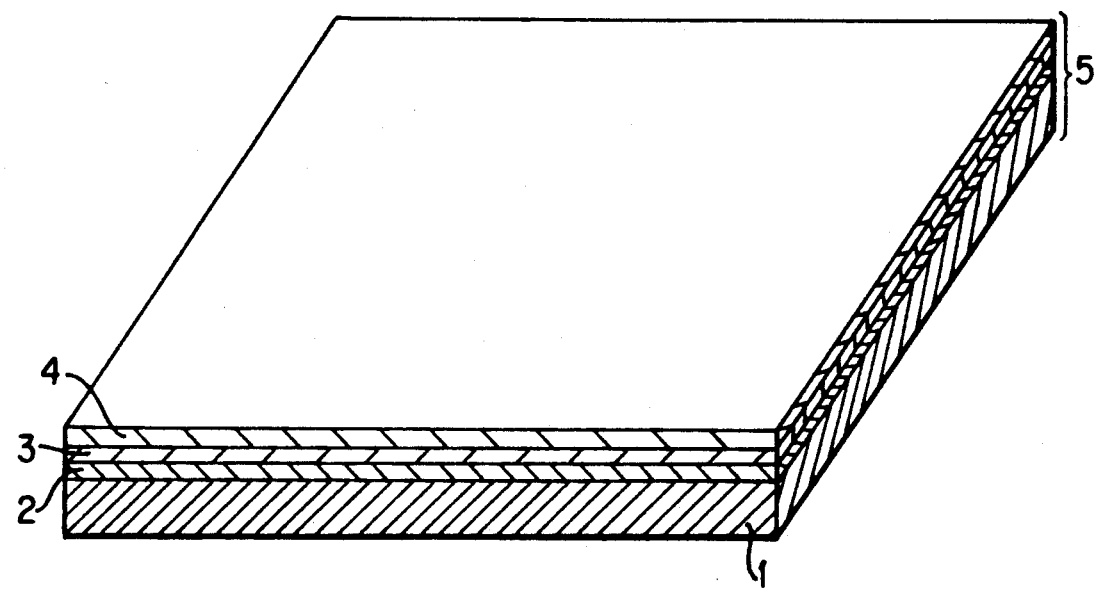
FIG. 1 is a schematic perspective view showing an image transferred product formed by transferring an image to any type of image receiving medium according to the present invention.

A preferred embodiment of the present invention will be described with reference to the accompanying drawings. FIG. 1 is a schematic perspective view showing an image transferred product 5 formed by a method which embodies the present invention. The image transferred product 5 comprises any type of image receiving medium 1 upon which it is desired to place an image, an adhesive layer 2 adhered thereon, a developer layer 3, which is a part of a developer medium, adhered onto the adhesive layer 2, and a thermoplastic resin layer 4 adhered onto the developer layer 3.

As shown in FIG. 1, a first manufacturing method for forming the image transferred product 5 which is structured so that the adhesive layer 2 is inserted between the developer layer 3 of the developer medium and the image receiving medium 1 will now be explained. A special type of developer medium 11 as shown in FIG. 2 is used for this first manufacturing method.

Figure 2:
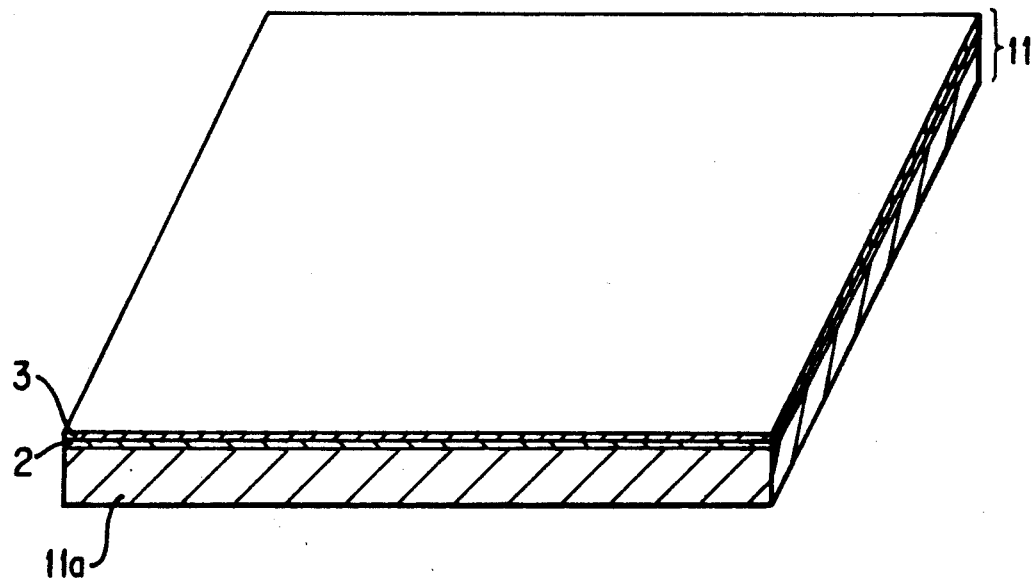
FIG. 2 is a schematic perspective view showing a special type of developer medium according to the present invention.

One type of image formation medium is a special type of developer medium 11 shown in FIG. 2 which comprises a base sheet 11a, an adhesive layer 2 coated thereon, and a developer layer 3 coated onto adhesive layer 2. The base sheet 11a of the special type of developer medium 11 shown in FIG. 2 is selected from sheet materials having a smooth and good lubricative surface such a polyester films, polyethylene films, polypropylene films, paper or the like.

The developer layer 3 is selected from any of a number of types of developer materials, for example, phenol group compounds such as P-phenylphenol or the like; and aromatic carboxylic acid group compounds such as salicylic acid, gallic acid, propyl tannic acid or the like. Further, the above developer materials are mixed with a thermoplastic binder, and coated onto the base sheet 11a.

The adhesive layer 2 is selected from heat sensitive adhesive materials and pressure sensitive adhesive materials. Vinyl resin such as vinyl alcohol-vinyl acetate copolymer, vinyl alkyl ether-maleic acid anhydride copolymer, polyvinyl chloride, vinyl chloride-vinyl acetate copolymer or the like; styrene resin; polyamide resin; wax; chlorinated rubber; and synthetic rubber are used as the heat sensitive adhesive material. Acrylic polymer or the like are used as the pressure sensitive adhesive materials. Alternatively, it is preferable that the adhesive layer 2 is waterproofed. Accordingly, the above heat sensitive adhesive materials and pressure sensitive adhesive materials have waterproofing characteristics.

In this first embodiment, a polyethylene terephthalate film was used as the base sheet 11a of the special type of developer medium 11. A 40% ethylene-vinyl acetate copolymer emulsion was coated by means of a bar coater #12 (not shown) onto base sheet 11a as the adhesive layer 2, and was dried in an oven at 120° C. for 60 sec. A mixture of acid clay, P-phenylphenol and polyvinyl alcohol was used as the developer material 3.

The image transfer type recording method using this special type of developer medium 11 shown in FIG. 2 will now be explained. First, an image forming process for forming an image onto the special type of developer medium will be described using the device shown in FIG. 4. Microcapsules including a dyeprecursor and a photosensitive material are coated onto the surface of a photosensitive and pressure sensitive medium 13. The photosensitive and pressure sensitive medium 13 is exposed to light irradiated from a lamp 15, reflected by an original 14 and focused by a lens 16. Next, by means of a feeding system (not shown), the microcapsule coated side of the photosensitive and pressure sensitive medium 13 and the developer coated side of the developer medium 11 to which the developer is coated are superposed, and are passed between pressure rollers 17, so that the non-hardened micro-capsules are ruptured and a visible image is formed on the developer medium 11.

Figure 5:
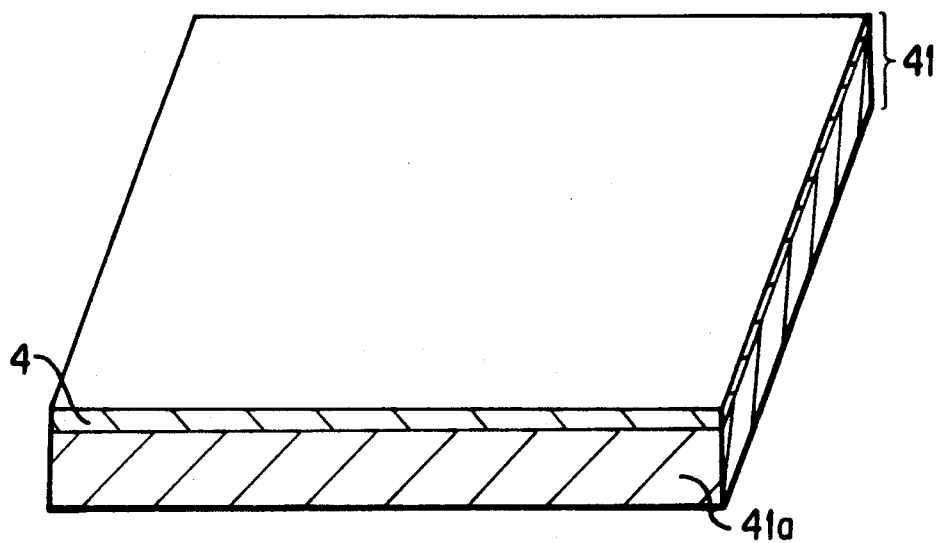
FIG. 5 is a schematic perspective view showing a thermoplastic resin medium usable in the present invention.
Figure 6:
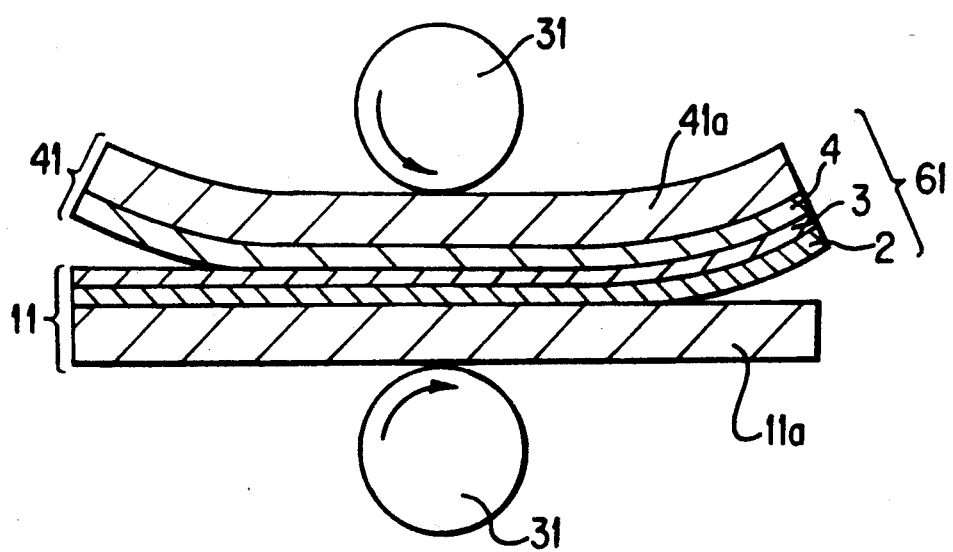
FIG. 6 is a cross-sectional side view showing a process for peeling off a developer layer from the special developer medium of FIG. 2.

Next, a transferring process for transferring the visible image formed onto the developer medium 11 to any type of image receiving medium will be explained with reference to FIG. 5 through FIG. 7. For this process, a thermoplastic resin medium 41 shown in FIG. 5 is used. The thermoplastic resin medium 41 comprises a base sheet 41a, and a thermoplastic resin layer 4 coated thereon. A plastic film, paper, etc. can be used as the base sheet 41a of the thermoplastic resin medium 41, if the base sheet material is not transformed by the heat source such as a heat roller (41 in FIG. 6). In particular, polyethylene terephthalate films are desirable for use as the base sheet 41a. Vinyl resin such as vinyl alcohol-vinyl acetate copolymer, polyvinyl chloride, vinyl chloride-vinyl acetate copolymer or the like; acrylic resin such as poly acrylic ethyl, poly butyl methacrylate, cyano methyl acrylate or the like; styrene resin; polyamide resin; and/or wax can be used as the thermoplastic resin layer 4.

In this embodiment, a polyethylene terephthalate film was used for the base sheet 41a of the thermoplastic resin medium 41, and the thermoplastic resin layer 4 was formed by applying a 41% emulsion of a styrene-acryl copolymer onto the base sheet 41a by means of the bar coater #12 (not shown).

Figure 9:
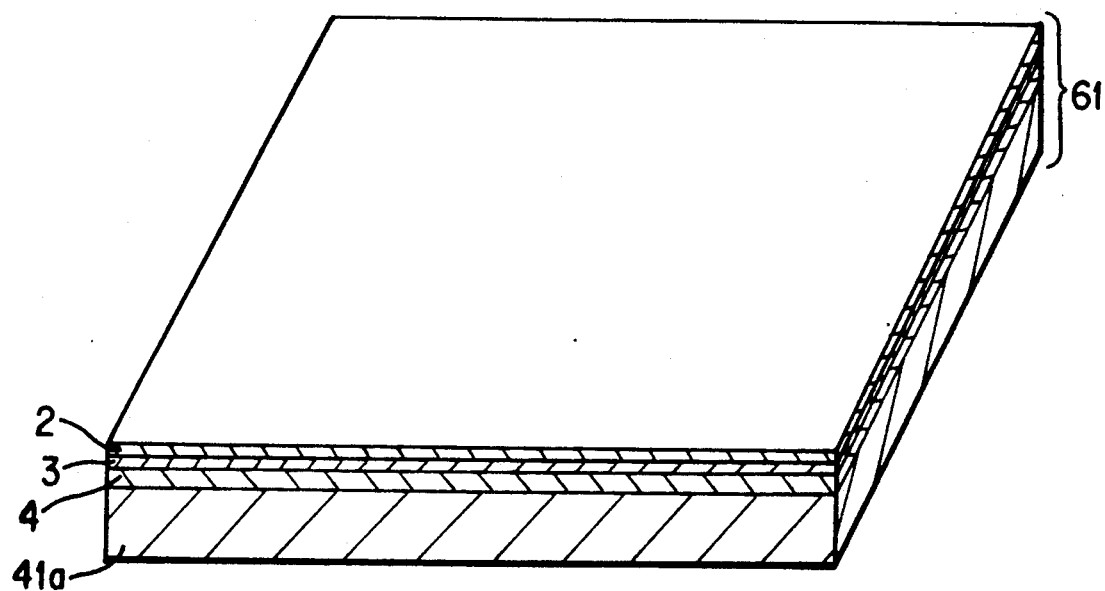
FIG. 9 is a schematic perspective view of an image transferring medium according to the present invention.

A process for peeling off a sheet on which an image is formed is explained with reference to FIG. 6. First, the thermoplastic resin layer 4 of the thermoplastic resin medium 41 shown in FIG. 5 and the side of the special type of developer medium 11 containing developer layer 3 and on which the visible image has been formed are superposed. Those superposed mediums are passed through and heat-pressed by heat rollers 31, thereby causing the thermoplastic resin medium 41 and the special type of developer medium 11 to be thermally adhered to each other. Any means can be used as an alternative to the heat rollers 31, for example, a hot flat iron, as long as it is a heating means. Then, the base sheet 11a of the special type of developer medium 11 is peeled off after the above-described heat-pressing process. As a result, the adhesive layer 2 and the developer layer 3 of the special type of developer medium 11 are transferred to the thermoplastic resin layer 4 of the thermoplastic resin medium 41, and an image transferring medium 61 as shown in FIG. 9 is formed. The image transferring medium 61 comprises the base sheet 41a of the thermoplastic resin medium 41, the thermoplastic resin layer 4 adhered thereon, the developer layer 3 adhered on the thermoplastic resin layer 4 and the adhesive layer 2 adhered on the developer layer 3. If necessary, a tool can be used for peeling off sheet 11a.

Next, a process for transferring an image to any type of image receiving medium by using the image transferring medium 61 is described with reference to FIG. 7. Post cards, ordinary papers, cloths, plastic cards, etc. can be used as the image receiving medium 1. The adhesive layer 2 of the image transferring medium 61 and the image receiving medium 1 are superposed, and those mediums are passed through and heat-pressed by heat rollers 31. The temperature of the rollers of this embodiment is set at 100° C. Afterwards, the base sheet 41a of the thermoplastic resin medium 41 is peeled off.

As a result, the image transferred product 5 shown in FIG. 1 is thus formed.

Figure 3:
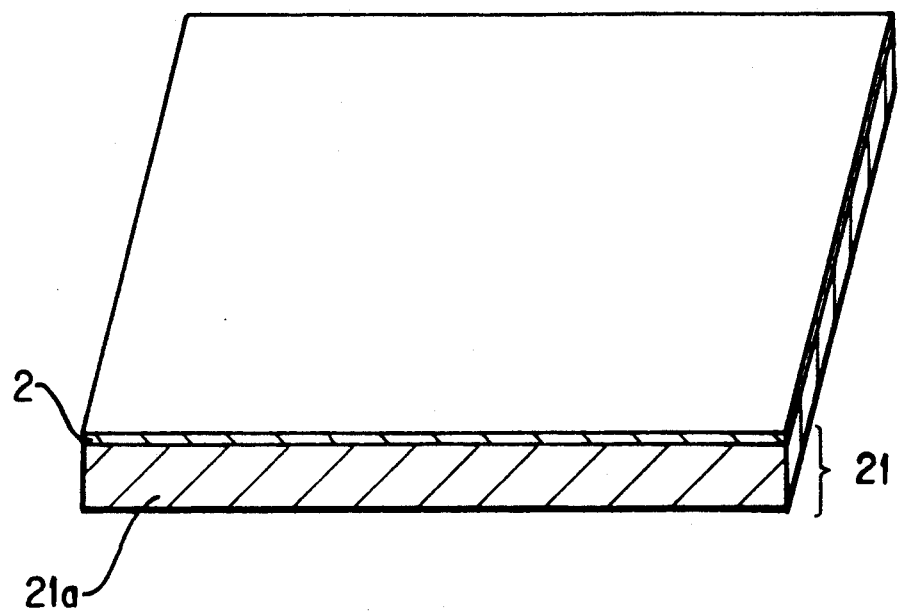
FIG. 3 is a schematic perspective view showing an adhesive medium according to the present invention.
Figure 8:
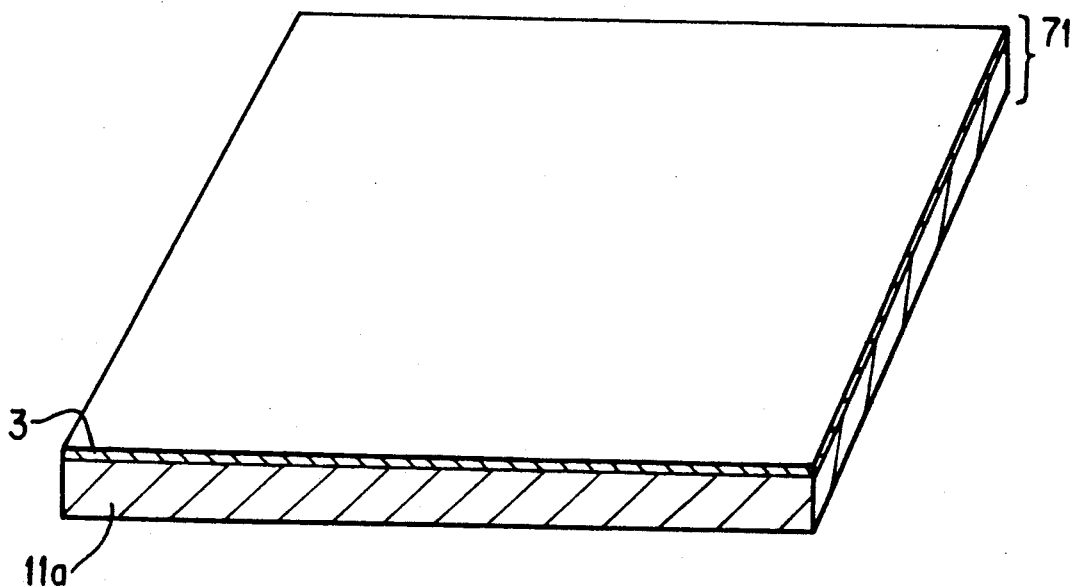
FIG. 8 is a schematic perspective view showing a general type of developer medium usable in the present invention.

The materials for use in the methods of the present invention are not limited to the above-described embodiment. Each of the materials listed in this specification, as well as other materials can be used. However, it is preferable to meet the following conditions. First, the adhesive power between the base sheet 11a and the adhesive layer 2 should be smaller than each of the adhesive powers between: the adhesive layer 2 and the developer layer layer 3; the developer layer 3 and the thermoplastic resin layer 4; and the thermoplastic resin layer 4 and the base sheet 41a. Next, the adhesive power between the thermoplastic resin layer 4 and the base sheet 41a should be smaller than each of the adhesive powers between: the thermoplastic resin layer 4 and the developer layer 3; the developer layer 3 and the adhesive layer 2; and the adhesive layer 2 and the image receiving medium Next, a second manufacturing method for forming the image transferred product 5 shown in FIG. 1 will be described. Another type of image formation medium is a general type of developer medium 71 as shown in FIG. 8 which is used in conjunction with an adhesive medium 21 as shown in FIG. 3 for the second manufacturing method. The adhesive medium 21 comprises a base sheet 21a, and an adhesive layer 2 coated thereon. The general type of developer material 71 comprises a base sheet 11a, and a developer layer 3 coated thereon.

Figure 4:
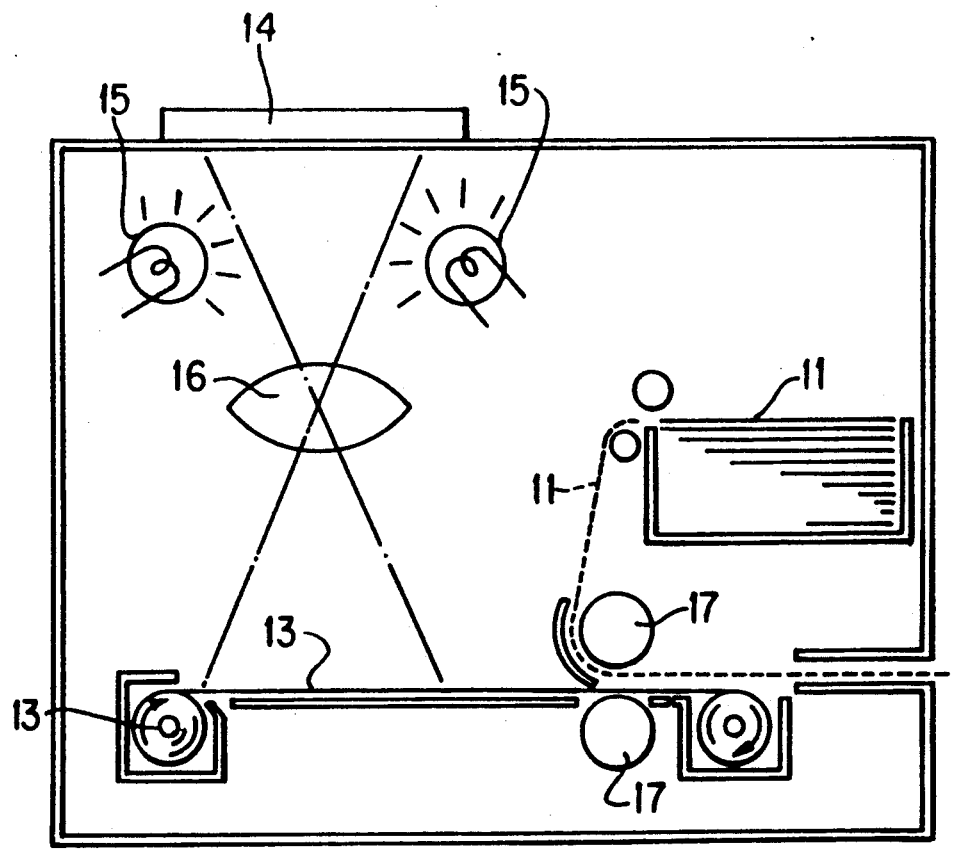
FIG. 4 is a schematic view, partially in section, of an apparatus for forming a color image onto a developer medium.

The image is formed onto the developer layer 3 of the general type of developer medium 71. The method for forming the image on the developer layer 3 of the general type of developer medium 71 is similar to the method explained in the first manufacturing method (as illustrated in FIG. 4).

After forming a visible image on developer layer 3, the developer layer 3 of the general type of developer medium 71 on which the image is formed and the thermoplastic resin layer 4 of thermoplastic resin medium 41 are superposed. Those superposed mediums are passed through and heat-pressed by the heat rollers 31, thereby causing the developer layer 3 and the thermoplastic resin layer 4 to be thermally adhered to each other. Afterwards, the base sheet 11a of the general type of developer medium 71 is peeled off from the developer layer 3.

Next, the developer layer 3 which is transferred to the thermoplastic resin medium 41 and the adhesive layer 2 of the adhesive medium 21 are superposed. Those mediums are passed through and heat-pressed by the heat rollers 31, thereby causing the developer layer 3 and the adhesive layer 2 to be thermally adhered to each other. Afterwards, the base sheet 21a of the adhesive medium 21 is peeled off from adhesive layer 2. As a result, the adhesive layer 2 and the developer layer 3 of the general type of developer medium 71 are transferred to the thermoplastic resin layer 4 of the thermoplastic resin medium 41, and an image transferring medium 61 as shown in FIG. 9 is formed. The image transferring medium 61 comprises the base sheet 41a of the thermoplastic resin medium 41, the thermoplastic resin layer 4 adhered thereon, the developer layer 3 adhered onto thermoplastic resin layer 4 and the adhesive layer 2 adhered onto developer layer 3.

Figure 7:
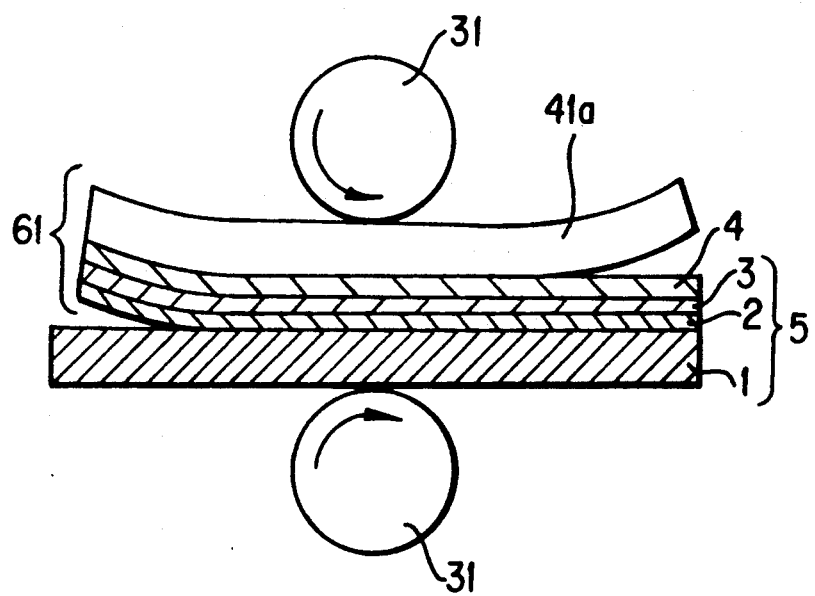
FIG. 7 is a cross-sectional side view showing an image transfer process for transferring a visible image from the developer medium to any type of image receiving medium.

Finally, as shown in FIG. 7, the adhesive layer 2 of the image transferring medium 61 and any type of image receiving medium 1 are superposed, and those superposed mediums are passed through and heat-pressed by the heat rollers 31, thereby causing the adhesive layer 2 and the image receiving medium 1 to be thermally adhered to each other. Afterwards, the base sheet 41a of the thermoplastic resin medium 41 is peeled off. As a result, the image transferred product 5 shown in FIG. 1 is thus formed.

It is preferable to provide the various media used to practice the above methods in the form of a kit. The kit includes a thermoplastic resin medium, an image formation medium, and optionally, an adhesive medium. Preferably the above media are sealed within a package. The thermoplastic resin medium includes a first base sheet having a thermoplastic resin layer formed thereon. The image formation medium includes a second base sheet and an image formation layer either formed on the second base sheet, or formed on an adhesive layer which is located on the second base sheet. If the adhesive layer is not provided on the second base sheet, the adhesive layer is formed on a third base sheet, which together form the adhesive medium. The image formation layer can be, for example, a developer material which is capable of forming a visible image upon reacting with a dyeprecursor.

Figure 10B:
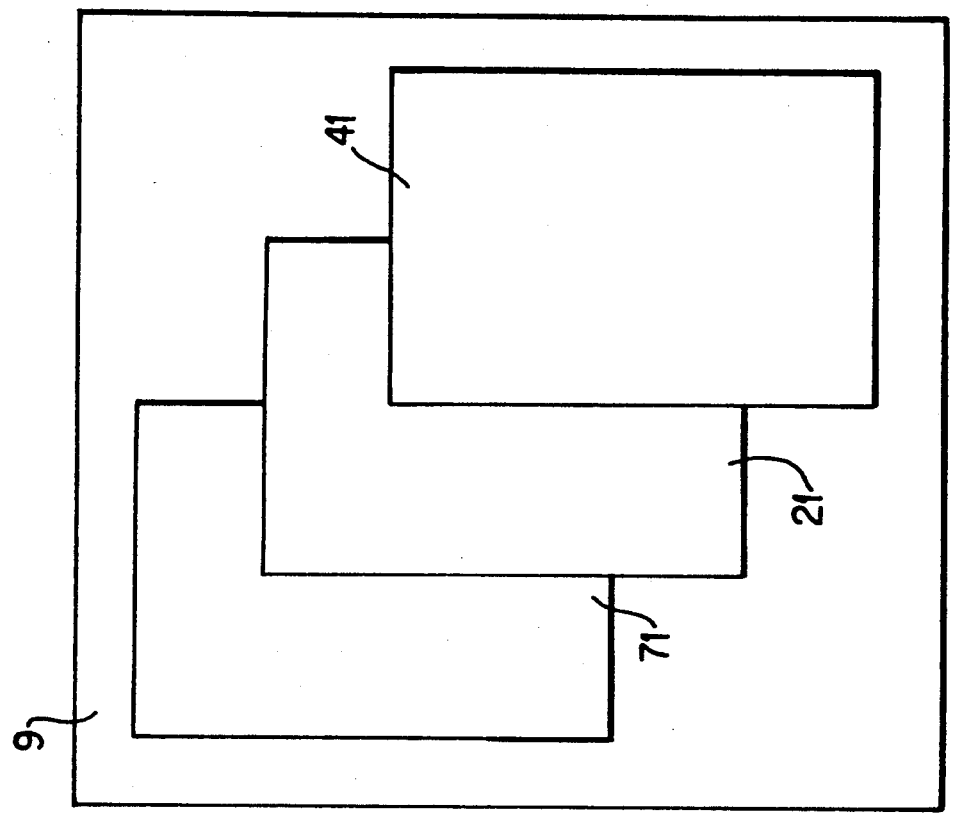
FIGS. 10A and 10B are schematic illustrations of packages containing the various media which make up the kits of the present invention.
Figure 10A:
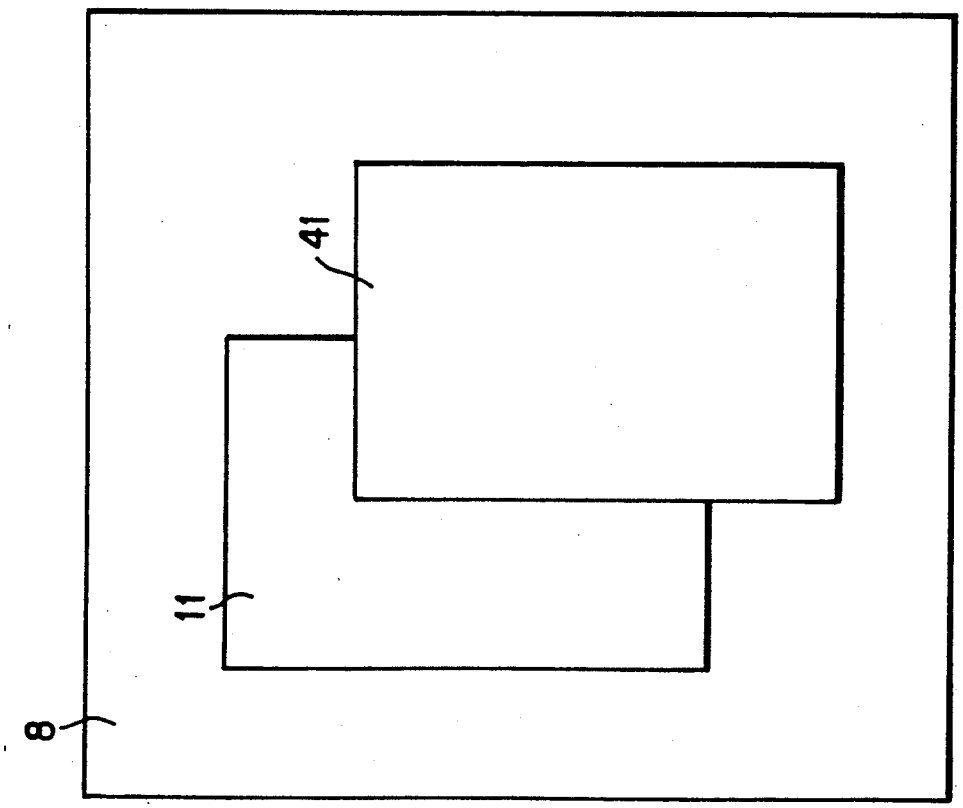

FIG. 10A illustrates a kit which includes the special type of developer medium 11 and the thermoplastic resin medium 41 sealed within package 8. FIG. 1B illustrates a kit which includes the general type of developer medium 71, adhesive medium 21 and thermoplastic resin medium 41 contained in a sealed package 9. Alternatively, it is possible to provide a sealed package containing a plurality of one of the above-described media therein, with a separate package being provided for each type of medium. For example, a plurality of sheets of the special type of developer medium can be provided in one sealed package, a plurality of sheets of thermoplastic resin medium can be provided in a second sealed package, and the first and second sealed packages can be provided in an outer container.

It is to be understood that the present invention is not restricted to the particular forms shown in the foregoing embodiments. Various modifications and alterations can be made thereto without departing from the scope of the invention encompassed by the appended claims.

For example, it is possible to form the image transferred product 5 without making the image transferring medium 61. That is, first, any type of image receiving medium 1 and the adhesive medium 21 are superposed and heated, and the base sheet 21a of the adhesive medium 21 is peeled off so that the adhesive layer 2 is formed on the image receiving medium 1. The adhesive layer 2 on the image receiving medium 1 and the thermoplastic resin medium 31 to which the developer layer 3 is transferred are then superposed (with developer layer 3 in contact with adhesive layer 2), and those superposed mediums are passed through and heat-pressed by the heat rollers 31, thereby causing the adhesive layer 2 and the developer layer 3 to be thermally adhered to each other. Afterwards, the image transferred product 5 is made by peeling off the base sheet 41a of the thermoplastic resin medium 41.

Additionally, while a developer medium has been described as being used as the image formation medium, other mediums are possible. For example, any image formation medium can be used in the present invention as long as it contains an image formation layer which can: contain a visible image therein; is located on a base sheet; and can be transferred from the base sheet to a resin layer. Accordingly, the image formation medium is not limited to developer mediums which contain a developer layer reactable with a dyeprecursor to form a visible image.

What is claimed is:

1. An image transfer type recording method comprising the steps of:
    superposing a thermoplastic resin layer of a thermoplastic resin medium having a first base sheet and said thermoplastic resin layer formed on said first base sheet with an image formation layer of an image formation medium having a second base sheet and said image formation layer formed on said second base sheet, said iamge formation layer having an image formed therein;
    adhering said thermoplastic resin layer to said image formation layer by heating said superposed thermoplastic resin medium and said image formation medium;
    separating said second base sheet from said iamge formation layer;
    inserting an adhesive layer between an image receiving medium to which said image formation layer is to be permanently adhered and said image formation layer;
    adhering said image receiving medium tos aid image formation layer by superposing said image receiving medium with said image formation layer, with said adhesive layer located therebetween; and
    separating said first base sheet form said thermoplastic resin layer.

2. The method of claim 1, wherien said image receiving medium is adhered to said image formation layer by applying heat and pressure thereto with said adhesive layer therebetween.

3. The method of claim 1, wherein said adhesive layer is inserted between said image receiving medium and said image formation layer by applying said adhesive layer to said image formation layer prior to adhering said image receiving medium to said image formation layer.

4. The method of claim 3, wherein said adhesive layer is applied to said image formation layer by superposing an adhesive medium having a third base sheet with said adhesive layer formed thereon with said image formation layer so that said image formation layer and said adhesive layer contact each other, and removign said third base sheet from said adhesive layer.

5. The method of claim 4, wherein said superposed image formation layer and said adhesive medium are heated prior to removal of said third base sheet.

6. An image transfer type recording method comprising the steps of:
    superposing a thermoplastic resin layer of a thermoplastic resin medium having a first base sheet and said thermoplastic resin layer formed on said first base wheet with an image formation layer of an image formation medium having a second base sheet, an adhesive layer formed on said second base sheet and said image formation layer formed on said adhesive layer, said image formation layer having an image formed therein;
    adhering said thermoplastic resin layer with said image formation layer by heating the superposed thermoplastic resin medium and said image formation medium;
    separating said second base sheet from said adhesive layer and said image formation layer;

adhering an image receiving medium to which said image formation layer is to be permanently adhered with said image formation layer by superposing said image receiving medium with said image formation layer, with said adhesive layer located therebetween; and separating said first base sheet from said thermoplastic resin layer.

7. The method of claim 6, wherein said image receiving medium is adhered to said image formation layer by applying heat and pressure thereto wtih said adhesive layer therebetween.

* * * * *